United States Patent
Kifune et al.

(10) Patent No.: US 10,452,476 B2
(45) Date of Patent: Oct. 22, 2019

(54) MEMORY SYSTEM AND METHOD OF CONTROLLING NONVOLATILE MEMORY

(71) Applicant: Toshiba Memory Corporation, Minato-ku (JP)

(72) Inventors: Naoko Kifune, Yokohama (JP); Hironori Uchikawa, Fujisawa (JP); Daiki Watanabe, Yokohama (JP)

(73) Assignee: Toshiba Memory Corporation, Minato-ku (JP)

( * ) Notice: Subject to any disclaimer, the term of this patent is extended or adjusted under 35 U.S.C. 154(b) by 45 days.

(21) Appl. No.: 15/918,021

(22) Filed: Mar. 12, 2018

(65) Prior Publication Data

US 2019/0087265 A1 Mar. 21, 2019

(30) Foreign Application Priority Data

Sep. 15, 2017 (JP) ................................ 2017-178095

(51) Int. Cl.
*G06F 11/10* (2006.01)
*H03M 13/39* (2006.01)
(Continued)

(52) U.S. Cl.
CPC ...... *G06F 11/1068* (2013.01); *G06F 11/1012* (2013.01); *G11C 29/52* (2013.01);
(Continued)

(58) Field of Classification Search
CPC .. G06F 11/1068; G06F 11/1012; G11C 29/52; G11C 2029/0411; H03M 13/3905; H03M 13/45; H03M 13/451
(Continued)

(56) References Cited

U.S. PATENT DOCUMENTS 5,651,032 A * 7/1997 Okita .................. H03M 13/256
375/265
5,949,796 A * 9/1999 Kumar .................. H04H 20/22
370/487
(Continued)

FOREIGN PATENT DOCUMENTS

JP 4490922 6/2010

OTHER PUBLICATIONS

Pyndiah Near-Optimum Decoding of Product Codes: Block Turbo Codes, Aug. 1998, IEEE, vol. 46, No. 8, pp. 1003-1010. (Year: 1998).*
(Continued)

*Primary Examiner* — John J Tabone, Jr.
(74) *Attorney, Agent, or Firm* — Oblon, McClelland, Maier & Neustadt, L.L.P.

(57) ABSTRACT

According to an embodiment, a memory system includes: a test pattern decoding unit that detects an intermediate decoding word from a plurality of test patterns; a Euclid distance calculating unit that calculates a Euclid distance between the intermediate decoding word and a received word; and a maximum likelihood decoding word selecting unit that maintains a maximum likelihood decoding word candidate. In a case where a Euclid distance of the intermediate decoding word is shorter than a Euclid distance of the maximum likelihood decoding word candidate, the maximum likelihood decoding word selecting unit updates the maximum likelihood decoding word candidate by using the intermediate decoding word and the test pattern decoding unit does not execute decoding of a test pattern having no possibility that the Euclid distance of the intermediate decoding word becomes shorter than the Euclid distance of the maximum likelihood decoding word candidate.

20 Claims, 5 Drawing Sheets

(51) Int. Cl.
*H03M 13/45* (2006.01)
*G11C 29/52* (2006.01)
*G11C 29/04* (2006.01)

(52) U.S. Cl.
CPC ....... *H03M 13/3905* (2013.01); *H03M 13/45* (2013.01); *H03M 13/451* (2013.01); *G11C 2029/0411* (2013.01)

(58) Field of Classification Search
USPC ....... 714/764, 763, 768, 773, 777, 752, 794, 714/795, 799
See application file for complete search history.

(56) References Cited

U.S. PATENT DOCUMENTS

| | | | | |
|---|---|---|---|---|
| 5,968,199 | A * | 10/1999 | Khayrallah | H03M 13/00 714/780 |
| 6,460,160 | B1 * | 10/2002 | Classon | H03M 13/453 714/791 |
| 6,490,243 | B1 * | 12/2002 | Tanaka | H03M 13/00 370/216 |
| 6,810,095 | B2 * | 10/2004 | Naitou | H03M 13/3961 375/316 |
| 7,062,000 | B1 * | 6/2006 | Kishino | H03M 13/4107 375/262 |
| 7,860,181 | B2 * | 12/2010 | Yamagishi | H04L 25/497 375/262 |
| 8,341,502 | B2 | 12/2012 | Steiner et al. | |
| 8,468,431 | B2 | 6/2013 | Steiner et al. | |
| 8,675,783 | B1 * | 3/2014 | Matache | H03M 13/45 375/259 |
| 8,724,729 | B2 | 5/2014 | Murakami et al. | |
| 8,737,541 | B2 * | 5/2014 | Tanaka | H03M 13/451 375/267 |
| 9,588,772 | B2 * | 3/2017 | Watanabe | G06F 9/30145 |
| 9,852,022 | B2 * | 12/2017 | Yoshinaga | G06F 11/1068 |
| 2001/0004391 | A1 * | 6/2001 | Naitou | H03M 13/3961 375/341 |
| 2001/0034871 | A1 * | 10/2001 | Takeda | H03M 13/136 714/781 |
| 2001/0050926 | A1 * | 12/2001 | Kumar | H04H 20/30 370/529 |
| 2005/0094742 | A1 * | 5/2005 | Yee | H03M 13/00 375/267 |
| 2005/0207516 | A1 * | 9/2005 | Tonami | H04L 25/03038 375/341 |
| 2008/0056401 | A1 * | 3/2008 | Yamagishi | H04L 25/03197 375/265 |
| 2008/0109710 | A1 * | 5/2008 | Takanashi | H03M 13/3738 714/799 |
| 2008/0123764 | A1 * | 5/2008 | McNamara | H04L 1/0631 375/261 |
| 2009/0055414 | A1 * | 2/2009 | Heiman | H03M 13/3707 |
| 2010/0211858 | A1 * | 8/2010 | Saha | H03M 13/395 714/792 |
| 2012/0093266 | A1 * | 4/2012 | Sun | H03M 13/3905 375/341 |
| 2014/0153625 | A1 * | 6/2014 | Vojcic | H04L 1/005 375/224 |
| 2016/0210190 | A1 | 7/2016 | Ha et al. | |
| 2016/0246603 | A1 * | 8/2016 | Watanabe | G06F 9/30145 |

OTHER PUBLICATIONS

Liew et al. Systematic Redundant Residue Number System Codes: Analytical Upper Bound and Iterative Decoding Performance Over AWGN and Rayleigh Channels, Jun. 2006, IEEE, vol. 54, No. 6, pp. 1006-1016. (Year: 2006).*

Antoine Valembois, et al., "Box and Match Techniques Applied to Soft-Decision Decoding," IEEE Transactions on Information Theory, vol. 50, No. 5, May 2004, pp. 796-810.

* cited by examiner

MEMORY SYSTEM AND METHOD OF CONTROLLING NONVOLATILE MEMORY

CROSS-REFERENCE TO RELATED APPLICATIONS

This application is based upon and claims the benefit of priority from Japanese Patent Application No. 2017-178095, filed on Sep. 15, 2017; the entire contents of all of which are incorporated herein by reference.

FIELD

Embodiments described herein relate generally to a memory system and a method of controlling a nonvolatile memory.

BACKGROUND

In a memory system, generally, in order to protect data to be stored, coded data is stored. For this reason, in order to read data stored in a memory system, error correction coded data is decoded.

DETAILED DESCRIPTION

Figure 1:
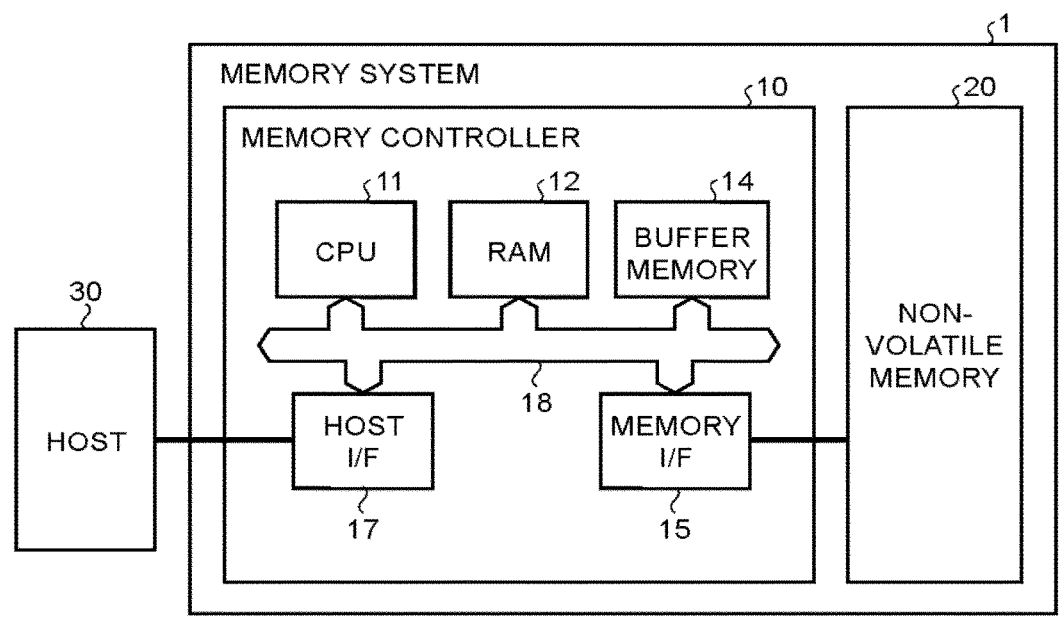
FIG. 1 is a block diagram that illustrates a schematic configuration example of a memory system according to a first embodiment.

In general, according to one embodiment, a memory system and a method of controlling a nonvolatile memory include: a nonvolatile memory; a soft decision value converting unit that converts a received word read from the nonvolatile memory into a received word having a soft decision value; a list generating unit that generates a list of a plurality of test patterns for the received word having the soft decision value; a test pattern decoding unit that detects an intermediate decoding word from the test pattern included in the list; a Euclid distance calculating unit that calculates a Euclid distance between the intermediate decoding word detected by the test pattern decoding unit and the received word; and a maximum likelihood decoding word selecting unit that maintains a maximum likelihood decoding word candidate, wherein, in a case where a Euclid distance of a first intermediate decoding word that is an intermediate decoding word detected by the test pattern decoding unit is shorter than a Euclid distance of the maintained maximum likelihood decoding word candidate, the maximum likelihood decoding word selecting unit updates the maintained maximum likelihood decoding word candidate by using the first intermediate decoding word and outputs the maximum likelihood decoding word candidate that is finally maintained as a soft decision output value, and the test pattern decoding unit does not execute decoding of a test pattern having no possibility that the Euclid distance of the intermediate decoding word becomes shorter than the Euclid distance of the maximum likelihood decoding word candidate maintained by the maximum likelihood decoding word selecting unit.

Exemplary embodiments of a memory system and a method of controlling a nonvolatile memory will be explained below in detail with reference to the accompanying drawings. The present invention is not limited to the following embodiments.

In soft decision decoding using a maximum likelihood decoding method, an input (received word) represents a probability of each bit (0, 1) stored in a memory cell being "0", and a list of code words that are candidates for a decoding word is generated from a received word by using an employed decoding algorithm. A code word that is a decoding target, for example, may be a multi-dimensional error correction code, which is represented by a product code doubly protecting user data using a two-dimensional component code of a component code in a column direction and a component code in a row direction, doubly or more protecting at least a part of user data using a component code of two or more dimensions. In such a case, a code word in a descriptive text corresponds to a component code of an error correction code of multi-dimensions. As such error correction codes of multi-dimensions, in addition to the product codes described above, there are graph codes of a concept generalizing product codes, generalized low-density parity check (LDPC) codes of a concept further generalizing the graphic codes, and the like.

Subsequently, a metric (an index representing likelihood of being a correct code word) called a Euclid distance representing the degree of separation between a received word and a code word of a decoding word candidate is calculated, and a code word of a decoding word candidate having a shortest Euclid distance is selected as a candidate for a maximum likelihood decoding word (hereinafter, referred to as a maximum likelihood decoding word candidate). Thereafter, a soft decision value (hereinafter, also referred to as a soft decision output value) of a code word selected as a maximum likelihood decoding word candidate is calculated and output. As decoding algorithms for generating a list of code words that are maximum likelihood decoding word candidates, there are Chase decoding, ordered statistics decoding (OSD), and the like.

In order to obtain a highest correction capability in soft decision decoding using the maximum likelihood decoding method, it is necessary to include all the code words in a list of decoding word candidates and calculate a Euclid distance for each of the code words for determining a maximum likelihood code word. However, a large amount of calculation is necessary for the calculation of Euclid distances for all the code words, and accordingly, there is a problem in that a delay time at the time of reading data becomes very long.

Thus, generally, in soft decision decoding mounted in a memory system, a list of patterns assuming a combination of the positions and the number of error bits called a "test pattern" is generated, and code words that become candidates are detected in accordance with a decoding algorithm while using such a test pattern, whereby code words that are targets for calculating Euclid distances are narrowed down.

As an example of a test pattern generating method, there is a method in which test patterns that become candidates are selected in order of lowest to highest sum of absolute values of the logarithmic likelihood ratios of soft decision values (hereinafter, also referred to as soft decision input values) of decoding targets. In addition, in OSD, a method such as a box and match algorithm is present. However, in such a method, there is a problem in that, as the number of test patterns to be listed up is decreased, the error correction capability is degraded. Thus in the following embodiments, a memory system capable of decreasing a delay time without degrading the error correction capability will be described in detail with reference to examples.

First Embodiment

FIG. 1 is a block diagram that illustrates a schematic configuration example of a memory system according to a first embodiment. As illustrated in FIG. 1, the memory system 1 includes a memory controller 10 and a nonvolatile memory 20. The memory controller 10 and the nonvolatile memory 20, for example, configure one memory system by employing such a combination. Examples of such a memory system 1 include a memory card such as an SD (registered trademark) card, a solid state drive (SSD), and the like.

The nonvolatile memory 20, for example, may be a nonvolatile memory such as a NAND flash memory. The number of nonvolatile memories 20 connected to one memory controller 10 is not limited to one, and thus, a plurality of nonvolatile memories 20 may be connected to the memory controller 10.

The memory controller 10 accesses the nonvolatile memory 20 in response to a command received from a host 30 connected through a host bus. The host 30 has a configuration of a computer. Here, a computer, for example, may be a personal computer, a server apparatus, a portable information device, a digital still camera, or the like. As a standard with which the host bus is compliant, an arbitrary standard may be employed.

The memory controller 10 includes: a central processing unit (CPU) 11; a random access memory (RAM) 12; a buffer memory 14; a memory interface (I/F) 15; and a host interface (I/F) 17, and these are interconnected through an internal bus 18.

The host I/F 17 transmits a command and data received from the host 30 to the CPU 11 and the buffer memory 14. In addition, the host I/F 17 transmits data stored in the buffer memory 14 to the host 30 in response to a command from the CPU 11.

The CPU 11 controls the overall operation of the memory controller 10. For example, when a write command is received from the host 30, the CPU 11 issues a write command to the memory I/F 15 in response thereto. At the time of reading or erasing data, similarly, the CPU 11 issues a read command or an erase command to the memory I/F 15 in respond to a command from the host 30. In addition, the CPU 11 executes various processes such as wear leveling or garbage collection for managing the nonvolatile memory 20.

The RAM 12, for example, is a semiconductor memory such as a dynamic RAM (DRAM) and is used as a work area of the CPU 11 or the like. In the RAM 12, firmware, various management tables, and the like for managing the nonvolatile memory 20 may be loaded.

The buffer memory 14 functions as a memory area temporarily storing writing data or reading data. The buffer memory 14 may be configured by using a DRAM, a static RAM (SRAM), or the like.

The memory I/F 15 is connected to one or more nonvolatile memories 20 through channels and controls communication with the nonvolatile memories 20. The memory I/F 15 outputs a signal ALE, a signal CLE, a signal Wen, and a signal REn to the nonvolatile memory 20 based on a command received from the CPU 11. For example, at the time of writing data, the memory I/F 15 transmits a write command issued by the CPU 11 and write data stored in the buffer memory 14 to the nonvolatile memory 20 as an input/output signal I/O. In addition, at the time of reading data, the memory I/F 15 transmits a read command issued by the CPU 11 to the nonvolatile memory 20 as an input/output signal I/O. Then, the memory I/F 15 receives data read from the nonvolatile memory 20 as an input/output signal I/O and transmits the read data to the buffer memory 14.

Here, the signal CEn is a signal used for causing the nonvolatile memory 20 to be in an enable state. The signal CLE is a signal used for notifying the nonvolatile memory 20 that an input signal I/O is a command. The signal ALE is a signal used for notifying the nonvolatile memory 20 that an input signal I/O is an address. The signal WEn is a signal used for causing the nonvolatile memory 20 to take in an input signal I/O. The signal REn is a signal used for reading an output signal I/O from the nonvolatile memory 20. A Ready/Busy signal RBn is a signal representing whether the nonvolatile memory 20 is in a ready state (a state in which a command can be received from the memory controller 10) or in a busy state (a state in which a command cannot be received from the memory controller 10). An input/output signal I/O, for example, is a signal of eight bits. The input/output signal I/O is actual data that is transmitted/received between the nonvolatile memory 20 and the memory controller 10 and is a command, an address, write data, read data, or the like.

Figure 2:
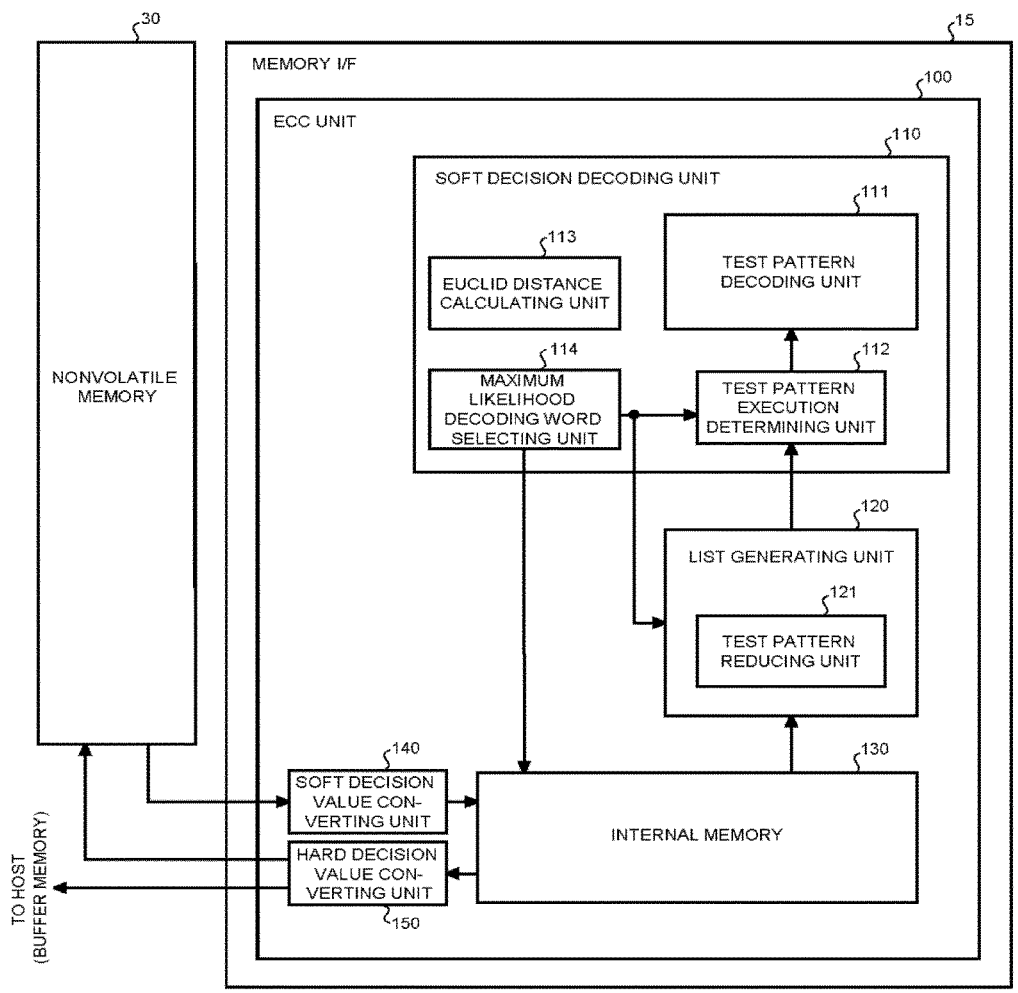
FIG. 2 is a block diagram that illustrates a detailed configuration example of a memory I/F according to the first embodiment.

FIG. 2 is a block diagram that illustrates a detailed configuration example of the memory I/F 15 illustrated in FIG. 1. As illustrated in FIG. 2, the memory I/F 15 includes an error correction code (ECC) unit 100 that codes data to be written into the nonvolatile memory 20 and decodes data read from the nonvolatile memory 20. The ECC unit 100 includes a soft decision value converting unit 140, an internal memory 130, a list generating unit 120, a soft decision decoding unit 110, and a hard decision value converting unit 150.

The soft decision value converting unit 140 converts data read from the nonvolatile memory 20 into a soft decision value (an LLR to be described later).

The internal memory 130 stores a received word read from the nonvolatile memory 20, a received word (hereinafter, referred to as LLR data) converted into a soft decision value (LLR) by the soft decision value converting unit 140, a decoding word (hereinafter, referred to as an intermediate decoding word) of a soft decision value that is generated in the process of decoding a test pattern for the LLR data using the soft decision decoding unit 110, and the like.

The soft decision decoding unit 110 executes soft decision decoding (soft bit decoding: SB decoding) of LLR data or an intermediate decoding word stored inside the internal memory 130.

The hard decision value converting unit 150 converts LLR data (for example, LLR data after completion of decoding; also referred to as a soft decision output value) stored inside the internal memory 130 into data of a hard decision value represented using binary values of (0, 1). In addition, the data of a hard decision value converted by the hard decision value converting unit 150 may be written into the nonvolatile memory 20 again (for example, at the time of executing garbage collection) or may be output to the host 30 through the buffer memory 14 or the like.

The list generating unit 120 generates a list of test patterns that are input for SB decoding. For example, in a case where there is an existing decoding word candidate (for example, in a case where maximum likelihood decoding word candidates are maintained in a maximum likelihood decoding word selecting unit 114 to be described later), the list generating unit 120 generates a list of test patterns having possibilities of having Euclid distances shorter than the Euclid distance of the decoding word candidate on the basis of the Euclid distance of the decoding word candidate.

In addition, the list generating unit 120 includes a test pattern reducing unit 121. In a case where a list generated by the list generating unit 120 is present, and there is an existing decoding word candidate, this test pattern reducing unit 121, on the basis of the Euclid distance of the decoding word candidate, deletes a test pattern having no possibility of having a Euclid distance shorter than the Euclid distance from the list.

The soft decision decoding unit 110 includes a test pattern decoding unit 111, a Euclid distance calculating unit 113, a maximum likelihood decoding word selecting unit 114, and a test pattern execution determining unit 112.

The test pattern decoding unit 111 sequentially decodes test patterns inside a list input from the list generating unit 120 in accordance with a specific algorithm.

The Euclid distance calculating unit 113 calculates a Euclid distance between a coded word (intermediate decoding word) detected by the test pattern decoding unit 111 and a received word.

The maximum likelihood decoding word selecting unit 114 compares a Euclid distance that is newly calculated by the Euclid distance calculating unit 113 with the Euclid distance of the existing maximum likelihood decoding word candidate and updates the maximum likelihood decoding word candidate using an intermediate decoding word having a smaller Euclid distance and maintains the maximum likelihood decoding word candidate.

The test pattern execution determining unit 112, on the basis of the Euclid distance of the maximum likelihood decoding word candidate maintained in the maximum likelihood decoding word selecting unit 114, determines whether or not SB decoding is executed for a test pattern of a list input from the list generating unit 120 and inputs a test pattern for which SB decoding is determined to be executed to the test pattern decoding unit 111.

In this way, in this embodiment, by including a function (the list generating unit 120 and the test pattern reducing unit 121) of not including a test pattern that cannot be a maximum likelihood decoding word in the list, the amount of calculation at the time of decoding is decreased, and the delay time is shortened. In addition, in this embodiment, by also including a function (the test pattern execution determining unit 112) of skipping SB decoding for a test pattern that cannot be a maximum likelihood decoding word, the amount of calculation at the time of decoding is decreased, and the delay time is shortened.

The ECC unit 100 may be disposed inside the memory controller 10 to be independent from the memory I/F 15. In such a case, for example, the CPU 11 executes control such that data read from the nonvolatile memory 20 is input to the ECC unit 100 through the memory I/F 15.

Subsequently, the flow of a decoding process according to this embodiment will be described in detail with reference to the drawing.

In the decoding process, first, target data is read from the nonvolatile memory 20. In reading data from the nonvolatile memory 20, hard decision reading (also referred to as hard bit (HB) reading) and soft decision reading (also referred to as soft bit (SB) reading) are executed.

In hard decision reading (hard bit (HB) reading), by applying a read voltage (hereinafter, referred to an HB read level) causing a read bit value to be switched as (0, 1) to each memory cell, data (also referred to as hard bit (HB) data) of a hard decision value that is binary data is read. In soft decision reading (soft bit (SB) reading), by applying a plurality of read levels (hereinafter, referred to as SB read levels) of which voltage values are shifted from the HB read level by $\pm\delta, \pm 2\delta, \ldots$ to each memory cell, data (also referred to as soft bit (SB) data) of a plurality of pages formed by a lower page, a middle page, an upper page, and the like is read.

The SB data read from each memory cell through SB reading represents the degree of deviation of a threshold voltage of each memory cell from an assumed (0, 1) state (threshold voltage distribution). This SB data can be converted into a log likelihood ratio (LLR) representing the reliability of a bit value (the correctness of the value) read from each memory cell.

Here, when a received word y is read from the nonvolatile memory 20, the LLR of the i-th bit $b_i$ of the received word y can be represented using Equation (1) as below. In Equation (1), $P(b_i=0|y)$ represents a probability of the value of the i-th bit $b_i$ being "0", and $P(b_i=1|y)$ represents a probability of the value of the i-th bit $b_i$ being "1".

$$LLR(b_i) = \log\left(\frac{P(b_i = 0 \mid y)}{P(b_i = 1 \mid y)}\right) \quad (1)$$

When the LLR obtained from Equation (1) is positive, this LLR suggests that the value of the i-th bit $b_i$ is "0". On the other hand, when the LLR is negative, it suggests that the value of the i-th bit $b_i$ is "1". In addition, the absolute value of the LLR represents the reliability of the value suggested by the sign of the LLR obtained from Equation (1). As the absolute value is larger, the reliability is higher, and, as the absolute value is smaller, the reliability is lower.

Figure 3:
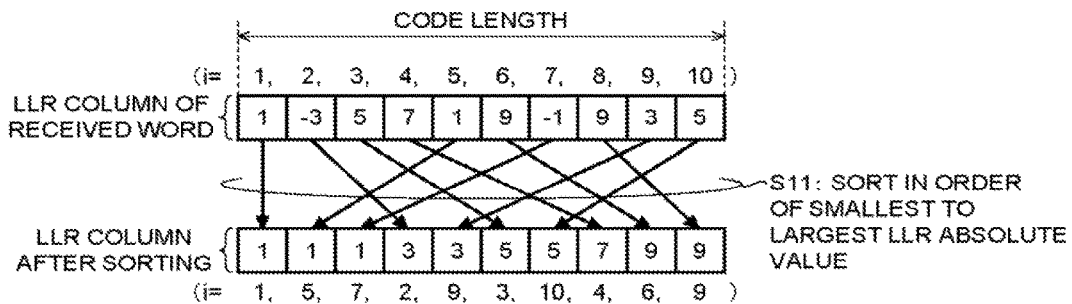
FIG. 3 is a diagram for describing sorting of an LLR column of a received word according to the first embodiment.

The soft decision value converting unit 140 converts the SB data of a plurality of pages read from each memory cell into an LLR and stores the LLR in the internal memory 130. In an upper stage of FIG. 3, an example of an LLR column generated by converting the received word of the SB data read from the nonvolatile memory 20. Theoretically, although the LLR is represented using a real number, in description presented below, as illustrated in FIG. 3, the LLR is assumed to be rounded to an integer to have a discrete value. Accordingly, the data stored inside the internal memory 130 is data (LLR data) represented using LLRs having discrete values.

The list generating unit 120, as illustrated in FIG. 3, sorts bits of the LLR data read from the internal memory 130 as an SB decoding target in order of smallest to largest absolute value of the soft decision value (LLR; also referred to as a soft decision input value) (S11). At that time, the list generating unit 120 may sort all the bits of the LLR data or sort a part of the bits of the LLR data (for example, a predetermined number of bits in order of smallest to largest absolute value of the LLR).

In addition, the list generating unit 120 generates a list of test patterns for Chase decoding in a case where the test pattern decoding unit 111 is designed to execute decoding in accordance with the Chase decoding algorithm and generates a list of tests patterns for OSD in a case where the test pattern decoding unit 111 is designed to execute decoding according to the OSD algorithm. In this embodiment, a case where the Chase decoding algorithm is employed will be described as an example, and a case where the OSD algorithm is employed will be described in a second embodiment to be described later.

In a case where a list of test patterns for Chase decoding is generated, the list generating unit 120 sequentially generates a list of test patterns at a flip number of "1", a list of test patterns at a flip number of "2", a list of test patterns at a flip number of "3", . . . , a list of test patterns at a flip number of "f" (here, f is an integer of "1" or more).

The size of a generated list (the number of test patterns) may be set from a maximum value of the number of bits to be flipped (hereinafter, referred to as a flip number) or may be set to the upper limit value of the number of test patterns in advance. Here, the size of the list (the number of test patterns) is set to a size satisfying an allowed delay time (LRB: LeastReliableBasis).

Figure 4:
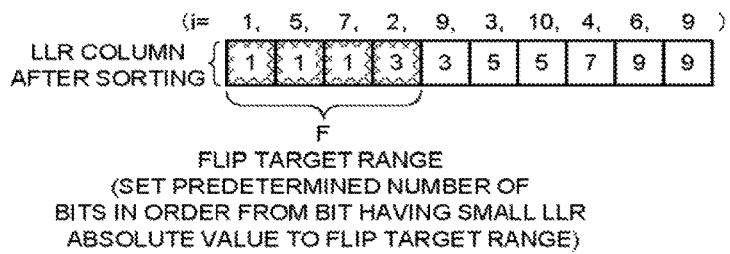
FIG. 4 is a diagram that illustrates a flip target range of an LLR column after sorting according to the first embodiment.

In addition, the range F of bits that are flip targets (flip target range), as illustrated in FIG. 4, for example, may be limited to a range, for an LLR column after sorting, up to a predetermined number (hereinafter, referred to as a threshold number) (n) in order of smallest to largest absolute value of the LLR. FIG. 4 illustrates a case where the threshold number (n) is set to "4".

In the method described above, in a case where the maximum value of the flip number is k, and the threshold number (n) is "4", the size of a list to be generated is a sum value (nC1+nC2+nC3+ . . . +nCk) of the number nC1 of combinations of test patterns having the number of flips as "1", the number nC2 of combinations of test patterns having the number of flips as "2", the number nC3 of combinations of test patterns having the number of flips as "3", . . . , the number nCk of combinations of test patterns having the number of flips as "k".

The priority levels of test patterns within the list, for example, may be set such that a test pattern flipping a bit having a smaller absolute value of the LLR has a higher priority level. In other words, the decoding order in the test pattern decoding unit 111, for example, may be set such that a test pattern flipping a bit having a smaller absolute value of the LLR has a higher priority level.

In addition, in this embodiment, as will be described later, when a test pattern having a flip number of "f" is generated for a code word having a correctable number t by using the Chase decoding algorithm, in a case where a decoding word that becomes one candidate is found (in other words, a maximum likelihood decoding word candidate is already maintained in the maximum likelihood decoding word selecting unit 114), and the Euclid distance is larger than (f+t)a+t+1 (here, a is an arbitrary natural number), a condition that the absolute value of the LLR is "a" or less is added to conditions of bits that are flipping targets at the time of generating a list. By adding such a condition, bits that are flipping targets are further narrow down from the bits within the flip target range F (FIG. 4). Accordingly, the number of combinations of bits to be flipped is decreased, and the number of test patterns to be generated is decreased. As a result, the amount of calculation at the time of decoding is reduced, and the delay time can be shortened.

The soft decision decoding unit 110 executes SB decoding by using an input soft decision input value (LLR). In this embodiment to which the Chase decoding algorithm is employed, the soft decision decoding unit 110 sequentially execute decoding having a flip number of "0" (the number of execution of decoding is one), decoding having a flip number of "1", decoding having a flip number of "2", decoding having a flip number of "3", . . . , decoding having a flip number of "k".

The Euclid distance calculating unit 113 calculates a Euclid distance between the code word (intermediate decoding word) detected by the test pattern decoding unit 111 and the received word. This Euclid distance, for example, may be a total sum of absolute values of the soft decision input values (LLR) corresponding to error bits.

Figure 5:
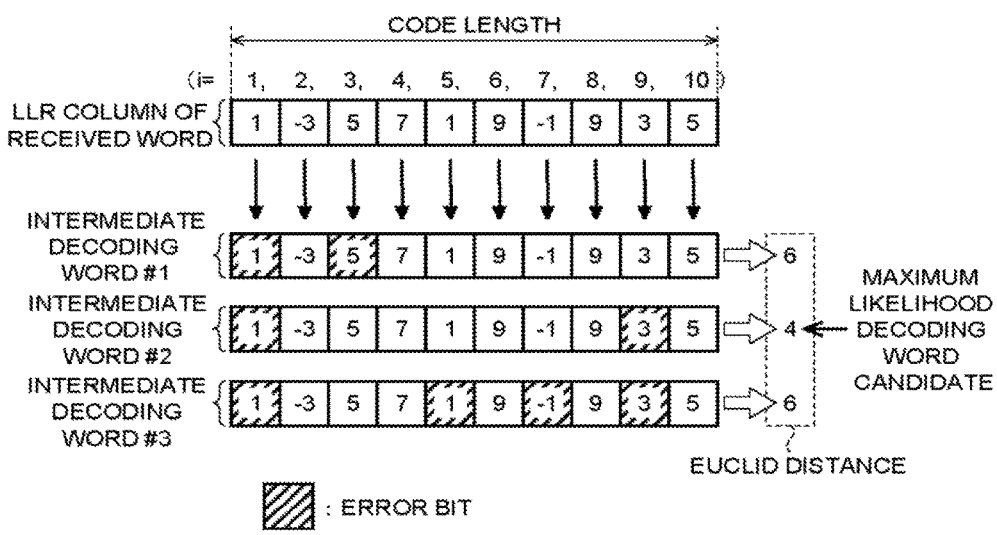
FIG. 5 is a diagram for describing a maximum likelihood decoding word candidate selected by a maximum likelihood decoding word selecting unit according to the first embodiment.

For example, as illustrated in FIG. 5, in a case where the test pattern decoding unit 111 detects that a first bit and a third bit of an intermediate decoding word #1 are error bits, the Euclid distance calculating unit 113 calculates a Euclid distance of the intermediate decoding word #1 as being a total sum "6" of the absolute value "1" of the first bit of the LLR and the absolute value "5" of the third bit of the LLR as the Euclid distance of the intermediate decoding word #1. In addition, similarly, for an intermediate decoding word #2, the Euclid distance calculating unit 113 calculates a total sum of the absolute values of the first and ninth bits of the LLR detected by the test pattern decoding unit 111 as error bits as a Euclid distance ("4"). Similarly, also for an intermediate decoding word #3, the Euclid distance calculating unit 113 calculates a total sum of the absolute values of the first, fifth, seventh and ninth bits of the LLR detected by the test pattern decoding unit 111 as error bits as a Euclid distance ("6").

The maximum likelihood decoding word selecting unit 114 stores the intermediate decoding word detected first and the Euclid distance as a maximum likelihood decoding word candidate. In addition, the maximum likelihood decoding word selecting unit 114, for an intermediate decoding word found for the second time or later, calculates a Euclid distance of the intermediate decoding word, compares the calculated Euclid distance with a Euclid distance of the stored maximum likelihood decoding word candidate, and stores the decoding word having a shorter Euclid distance as the maximum likelihood decoding word candidate again. Accordingly, in a case where the Euclid distance of the intermediate decoding word that has been newly detected is shorter, the stored maximum likelihood decoding word candidate is updated using the intermediate decoding word that has been newly detected.

Subsequently, the flow of SB decoding using the Chase decoding algorithm will be described with reference to a specific example.

In the Chase decoding algorithm, in a case where the correctable number t is "1", and decoding is executed using a test pattern having a flip number of "1", the number of acquired errors is a total of two bits acquired by adding the flip number of "1" to the correctable number t=1. At this time, since the acquired Euclid distance is a total sum of the absolute values of the LLRs of the detected error bits, combinations of an acquired Euclid distance and the absolute value of the LLR of the error bit can be listed as in the following Table 1.

[Table 1]

As can be known from Table 1, in a case where the correctable number t is "1", and the flip number is "1", in order to obtain a maximum likelihood decoding word candidate having a Euclid distance of "3" or less, one bit that is flip target is limited to a bit of which the absolute value of the LLR is "1" or less. In addition, in order to obtain a maximum likelihood decoding word candidate having a Euclid distance of "5" or less, one bit that is flip target is limited to a bit of which the absolute value of the LLR is "2" or less. By generalizing this, in order to obtain a maximum likelihood decoding word candidate having a Euclid distance of "2a+1" or less (here, a is an integer of "0" or more), it can be understood that one bit that is a flip target is limited to a bit of which the absolute value of the LLR is "a" or less.

In addition, in a case where the correctable number t is "1", and the flip number is "2", the number of error bits acquired as a result of Chase decoding is three bits. Accordingly, combinations of an acquired Euclid distance and the absolute value of the LLR of the error bit can be listed as in the following Table 2.

[Table 2]

As can be understood from Table 2, in order to obtain a maximum likelihood decoding word candidate having a Euclid distance of "3a+1" or less, each of two bits that are flip targets is limited to a bit of which the absolute value of the LLR is "a" or less.

From the description presented above, in coding in which the correctable number t is "1", in order to obtain a maximum likelihood decoding word candidate having a Euclid distance of "(f+1)a+1" or less at the flip number of "f", it is disclosed that each of f bits that are flip targets is limited to a bit of which the absolute value of the LLR is "a" or less.

Next, a case where the correctable number t is "2" will be described. In a case where the correctable number t is "2", and the flip number is "1", the number of error bits acquired as a result of Chase decoding is three bits. Accordingly, combinations of an acquired Euclid distance and the absolute value of the LLR of the error bit can be listed as in the following Table 3.

[Table 3]

As can be understood from Table 3, in coding in which the correctable number t is "2", in order to detect a maximum likelihood decoding word candidate having a Euclid distance of "3a+2" or less at a flip number of "f", it is disclosed that each of f bits that are flip targets may be limited to a bit of which the absolute value of the LLR is "a" or less.

In a case where the correctable number t is "2", and the flip number is "2", the number of detected error bits is four bits. Accordingly, combinations of an acquired Euclid distance and the absolute value of the LLR of the error bit can be listed as in the following Table 4.

[Table 4]

As can be understood from Table 4, in a case where the correctable number t is "2", and the flip number is "2", in order to detect a maximum likelihood decoding word candidate having a Euclid distance of "4a+2" or less, each of two bits that are flip targets may be limited to a bit of which the absolute value of the LLR is "a" or less.

As above, in a case where a code word having a correctable number t is decoded using a test pattern that is bit-flipped corresponding to a flip number f by using the Chase decoding algorithm, it is disclosed that, in order to detect a maximum likelihood decoding word candidate having a Euclid distance of "(f+t)a+t" or less, each of f bits that are flip targets may be limited to a bit of which the absolute value of the LLR is "a" or less.

For example, for a code word having a correctable number of "2", in a case where one maximum likelihood decoding word candidate is detected at a flip number of "0", and the Euclid distance is "9", in order to update the maximum likelihood decoding word candidate, the Euclid distance of the intermediate decoding word that is newly detected needs to be "8" or less. Thus, when a list of test patterns having a flip number of "1" is to be generated, the list generating unit 120 limits each of bits that are flip targets to a bit of which the absolute value of the LLR is "2" or less. Alternatively, in a case where a list of test patterns having a flip number of "1" is already generated, the test pattern reducing unit 121 disposed inside the list generating unit 120 deletes test patterns having each of bits that are test bits to be a bit of which the absolute value of the LLR is other than "1" or "2" from the list. In this way, each test pattern that cannot be a maximum likelihood decoding word can be excluded from the list, and accordingly, the amount of calculation at the time of decoding is reduced, and an effect of decreasing the delay time can be acquired.

In addition, in a case where, as a result of execution of Chase decoding using a list of test patterns having a flip number of "1" or in the middle of the execution, for example, a maximum likelihood decoding word candidate having a Euclid distance of "6" is detected, even when Chase decoding is executed using a test pattern in which a bit of which the absolute value of the LLR is "2" is flipped among the remaining test patterns of the list, the maximum likelihood decoding word candidate maintained in the maximum likelihood decoding word selecting unit 114 is not updated. Thus, in such a case, the test pattern execution determining unit 112 disposed inside the soft decision decoding unit 110 limits the test pattern decoding unit 111 not to execute Chase decoding for a test pattern having a bit of which the absolute value of the LLR is "2" flipped. For example, the test pattern execution determining unit 112 skips an input of the test pattern having a bit of which the absolute value of the LLR is "2" flipped to the test pattern decoding unit 111. In this way, since SB decoding of a test pattern that cannot be a maximum likelihood decoding word is skipped, the amount of calculation at the time of decoding is reduced, and an effect of shortening the delay time can be acquired.

Figure 6:
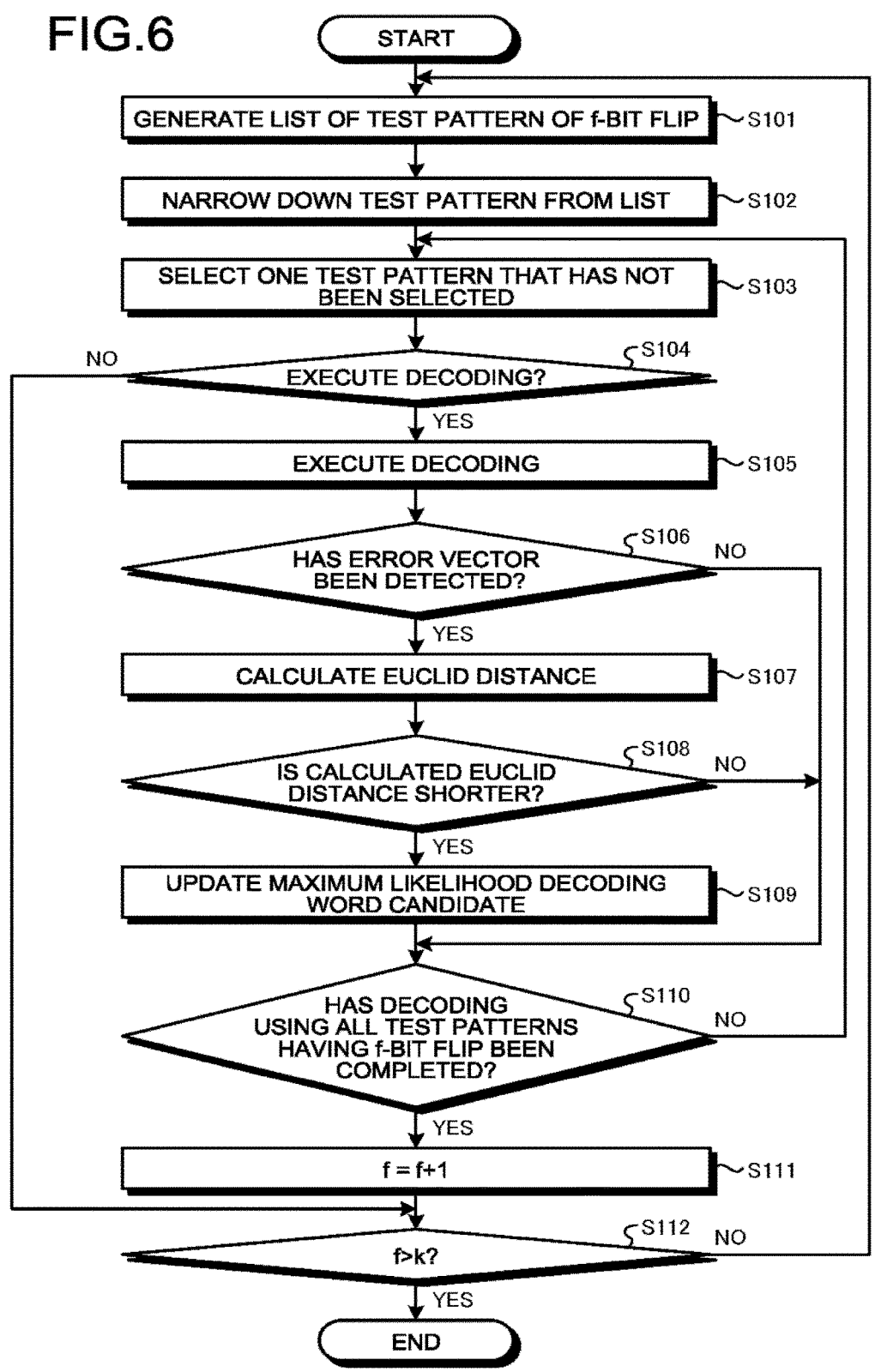
FIG. 6 is a flowchart that illustrates an example of a decoding operation according to the first embodiment.

Next, a decoding operation according to this embodiment will be described in detail with reference to the drawings. FIG. 6 is a flowchart that illustrates an example of a decoding operation according to this embodiment. As illustrated in FIG. 6, in this embodiment, first, the list generating unit 120 generates a list of test patterns having a flip number of "f" (hereinafter, referred to as test patterns of f-bit flip) (Step S101). Here, the initial value of f is assumed to be "1". In a case where a list of test patterns of f-bit flip is present, Step S101 may be skipped.

Next, the test pattern reducing unit 121 of the list generating unit 120 deletes test patterns having no possibility of being the maximum likelihood decoding word candidate among the listed test patterns of the f-bit flip, thereby narrowing down the test patterns that are decoding targets (Step S102). More specifically, the test pattern reducing unit 121, first, calculates a Euclid distance from a total sum of LLRs of bits assumed to be error bits for each of the listed test patterns. Subsequently, the test pattern reducing unit 121 acquires a Euclid distance of the maximum likelihood decoding word candidate stored in the maximum likelihood decoding word selecting unit 114. Thereafter, the test pattern reducing unit 121 deletes test patterns of which the Euclid distances are the Euclid distance of the maximum likelihood decoding word candidate or more among the listed test patterns from the list. In this way, since the test patterns that are decoding targets are narrowed down, the amount of calculation at the time of decoding is reduced, and the delay time can be shortened. In addition, in a case where the list generating unit 120 operates not to generate a test pattern having no possibility of being the maximum likelihood decoding word candidate in Step S101, Step S102 may be omitted. The list after the narrowing down is input to the test pattern execution determining unit 112 of the soft decision decoding unit 110.

Next, the test pattern execution determining unit 112 selects one test pattern, which has not been selected, from the input list (Step S103). In addition, as priority levels at the time of selection, for example, the priority levels may be set such that a test pattern flipping a bit having a smaller absolute value of the LLR has a higher priority level. By employing such a selection order, decoding of a test pattern in which a possibility of detecting an error vector is high can be executed with a high priority level, and, at a relatively early time in the flow of the decoding process, the Euclid distance of the maximum likelihood decoding word candidate stored in the maximum likelihood decoding word selecting unit 114 can be shortened. As a result, the number of test patterns not included in the list by the list generating unit 120, the number of test patterns deleted from the list by the test pattern reducing unit 121, and the number of test patterns that are targets to be skipped by the test pattern execution determining unit 112 are increased, and the amount of calculation at the time of decoding is further reduced, and the delay time can be further shortened.

Next, the test pattern execution determining unit 112 determines whether or not SB decoding using the selected test pattern is executed (Step S104). More specifically, the test pattern execution determining unit 112 specifies the Euclid distance of the selected test pattern. This Euclid distance may be input from the list generating unit 120 together with the list or may be calculated from a total sum of LLRs of bits assumed to be error bits in the test pattern selected by the test pattern execution determining unit 112. Subsequently, the test pattern execution determining unit 112 acquires a Euclid distance of the maximum likelihood decoding word candidate stored in the maximum likelihood decoding word selecting unit 114. Thereafter, in a case where the Euclid distance of the selected test pattern is less than the Euclid distance of the maximum likelihood decoding word candidate, the test pattern execution determining unit 112 determines to execute the SB decoding of the test pattern (Step S104: YES), and the process proceeds to Step S105. On the other hand, in a case where the Euclid distance of the selected test pattern is the Euclid distance of the maximum likelihood decoding word candidate or more, the test pattern execution determining unit 112 determines not to execute the SB decoding of the test pattern (Step S104: NO), and the process proceeds to Step S112. In this way, since the SB decoding of a test pattern from which the maximum likelihood decoding word candidate cannot be detected is skipped, the amount of calculation at the time of decoding is reduced, and the delay time can be shortened.

In Step S105, the test pattern for which the SB decoding is determined to be executed is input from the test pattern execution determining unit 112 to the test pattern decoding unit 111, and the test pattern decoding unit 111 executes the SB decoding using this input test pattern. Subsequently, the test pattern decoding unit 111 determines whether or not an error vector has been detected (Step S106). In a case where an error vector has not been detected (Step S106: NO), the process proceeds to Step S110. On the other hand, in a case where an error vector has been detected (Step S106: YES), the Euclid distance calculating unit 113 calculates a Euclid distance from the LLR of the bit flipped according to the test pattern and the LLR of an error bit represented by the detected error vector (Step S107). Subsequently, the maximum likelihood decoding word selecting unit 114 compares the Euclid distance that has been newly calculated by the Euclid distance calculating unit 113 with the Euclid distance of the stored maximum likelihood decoding word candidate (Step S108). In a case where the Euclid distance that has been newly calculated is less than the Euclid distance of the maximum likelihood decoding word candidate (Step S108: YES), the stored maximum likelihood decoding word candidate and the Euclid distance thereof are updated using the intermediate decoding word that has been newly detected by the SB decoding using the test pattern decoding unit 111 and the Euclid distance that has been newly calculated for the intermediate decoding word by the Euclid distance calculating unit 113 (Step S109), and the process proceeds to Step S110. On the other hand, in a case where the Euclid distance that has been newly calculated is the Euclid distance of the maximum likelihood decoding word candidate or more (Step S108: NO), the maximum likelihood decoding word candidate maintained by the maximum likelihood decoding word selecting unit 114 and the Euclid distance thereof are not updated, and the process proceeds to Step S110.

In Step S110, it is determined whether or not SB decoding of all the test patterns included in the list after the narrowing down of Step S102 has been completed. In a case where a test pattern for which the SB decoding has not been executed is present still (Step S110: NO), the process is returned to Step S103, and subsequent operations are executed for the newly-selected test pattern. On the other hand, in a case where the SB decoding of all the test patterns included in the list has been completed (Step S110: YES), the flip number f is incremented by one (Step S111), and then, the process proceeds to Step S112.

In Step S112, it is determined whether or not the flip number f is larger than the maximum value k of the flip number, in other words, whether or not the process for all the test patterns up to the maximum value k of the flip number has been completed. In a case where the flip number f is the maximum value k or less (Step S112: NO), the process is returned to Step S101, a list of test patterns of f-bit flip is generated for the new flip number f, and then, subsequent operations are executed. On the other hand, in a case where the flip number f is larger than the maximum value k (Step S112: YES), this operation ends.

As above, according to this embodiment, a test pattern having no possibility of the Euclid distance being shorter than the Euclid distance of the existing maximum likelihood decoding word candidate is excluded from the list and is not included in a decoding target, accordingly, the amount of calculation according to the maximum likelihood decoding method is reduced, and the delay time can be shortened. In addition, in a case where a new maximum likelihood decoding word candidate is detected in the middle of decoding, SB decoding of a test pattern having no possibility of the Euclid distance being shorter than the Euclid distance of this new maximum likelihood decoding word candidate is skipped, whereby the amount of calculation according to the maximum likelihood decoding is reduced, and the delay time can be shortened.

Second Embodiment

In the first embodiment described above, a case where the Chase decoding algorithm is employed has been described as an example. In contrast to this, in a second embodiment, a case where an OSD algorithm is employed will be described in detail as an example.

In this embodiment, the schematic configuration of a memory system including a memory I/F may be similar to the schematic configuration of the memory system 1 (see FIGS. 1 and 2) according to the first embodiment described above, and thus, detailed description thereof will not be presented here. In addition, also a decoding operation may be similar to the schematic operation example according to the first embodiment described with reference to FIG. 6 and the like, and thus, detailed description thereof will not be presented here.

Subsequently, the flow of SB decoding using the OSD algorithm will be described in a specific example. In this description, an information word that is a protection target is assumed to be protected by a code word having a correctable number of "t". In addition, for an input code word, as a result of limit distance decoding executed before OSD decoding, an intermediate decoding word having a Euclid distance of "b" is assumed to be detected as a maximum likelihood decoding word candidate. In this case, in an error vector acquired as a result of the OSD decoding, at least (t+1) error bits are included.

Figure 7:
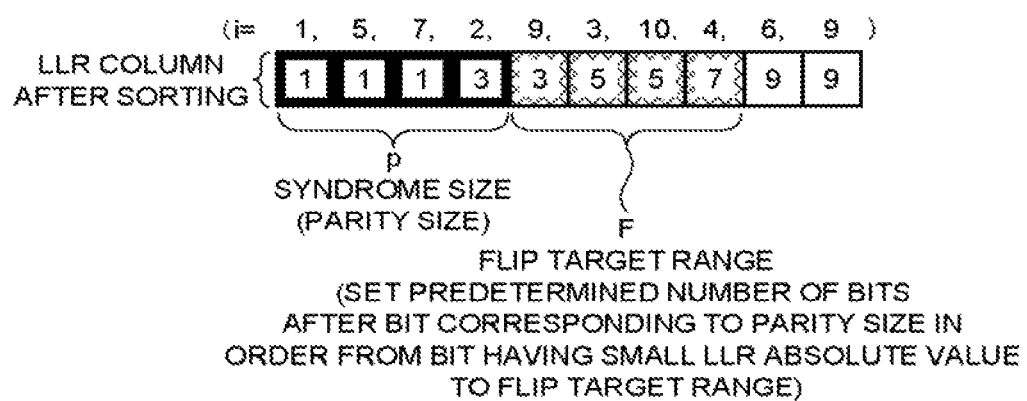
FIG. 7 is a diagram that illustrates a syndrome size and a flip target range for an LLR column after sorting according to a second embodiment.

When a test pattern used for OSD is generated, in a case where a range F of bits (flip target range) that are flip targets is set for a code word, a list generating unit 120, as illustrated in FIG. 7, for example, for the LLR column after sorting (S11) described with reference to FIG. 3, in order from a small absolute value of the LLR, regards a number (p+n) acquired by adding a predetermined threshold number (n) to a syndrome size (parity size) p as a range (hereinafter, referred to an error assumption range) in which there is a possibility of an error being present and sets a range corresponding to the predetermined threshold number (n) as the flip target range F. At that time, the threshold number (n) may have a value different for each flip number. FIG. 7 illustrates a case where the syndrome size is "4", and the threshold number (n) is "4".

In a phase (hereinafter, referred to as an OSD phase) 0 in an OSD algorithm, a soft decision decoding unit 110 executes decoding of the OSD phase 0 by using bits corresponding to the syndrome size in order from a smallest absolute value of the LLR among sorted bits. However, in a case where the LLR of the (t+1)-th bit from a bit of which the absolute value of the LLR is the smallest is the Euclid distance b of the maximum likelihood decoding word candidate or more, even when the decoding of the OSD phase 0 is executed, the maximum likelihood decoding word candidate inside the maximum likelihood decoding word selecting unit 114 is not updated. For this reason, in such a case, the list generating unit 120 does not generate a list and notifies the soft decision decoding unit 110 of "no pattern". In this case, an ECC unit 100 does not execute subsequent OSD but outputs the maximum likelihood decoding word candidate that has already been acquired as a soft decision output value that is a final decoding word.

After the OSD phase 0, from an OSD phase 1 to an OSD phase k (here, k corresponds to a maximum value of the flip number) is sequentially executed. More specifically, in an OSD phase j (here, j is 1 or more and k or less), the list generating unit 120 generates a list of a test pattern in which j bits within the flip target range F except bits of the syndrome size p used in the OSD phase 0 among the sorted bits are flipped and executes decoding of the OSD phase j in accordance with the list of test patterns generated by the soft decision decoding unit 110.

At that time, in a case where a code word having a Euclid distance of "c" is detected in the process until an OSD phase (j−1) (here, j is 1 or more and k or less), in the OSD phase j and subsequent phases, even in a case where a test pattern in which a sum of absolute values of LLRs of j bits assumed to be errors is larger than c is decoded, an intermediate decoding word detected in the decoding does not become the maximum likelihood decoding word candidate. Thus, in such a case, in the OSD phase j and subsequent phases, the list generating unit 120 generates a list not including a test pattern in which the sum of the absolute values of LLRs of j bits that are flip targets is larger than c. Alternatively, in a case where the list has already been present, the test pattern reducing unit 121 deletes a corresponding test pattern from this list, or the test pattern execution determining unit 112 excludes the test pattern from a decoding target executed by the test pattern decoding unit 111.

In addition, in a case where $1 \leq j < t$ (here, t is the correctable number of a code word), when a sum of the absolute values of (t+1−j) LLRs on the basis of the LRB is denoted by m, even in a case where a test pattern in which a sum of LLRs of j bits assumed to be errors is larger than "c−m" is decoded, an intermediate decoding word detected in the decoding does not become the maximum likelihood decoding word candidate. Thus, in such a case, in the OSD phase J and subsequent phases, the list generating unit 120 generates a list not including a test pattern in which a sum of the absolute values of LLRs of j bits that are flip targets is "c−m" or more. Alternatively, in a case where the list has already been present, the test pattern reducing unit 121 deletes a corresponding test pattern from this list, or the test pattern execution determining unit 112 excludes the test pattern from a decoding target executed by the test pattern decoding unit 111.

By employing the configuration and the operations described above, according to this embodiment, also in a case where the OSD algorithm is employed, similarly to the first embodiment, a test pattern having no possibility of the Euclid distance being shorter than the Euclid distance of the existing maximum likelihood decoding word candidate is excluded from the list and is not included in a decoding target, accordingly, the amount of calculation according to the maximum likelihood decoding method is reduced, and the delay time can be shortened. In addition, in a case where a new maximum likelihood decoding word candidate is detected in the middle of decoding, SB decoding of a test pattern having no possibility of the Euclid distance being shorter than the Euclid distance of this new maximum likelihood decoding word candidate is skipped, whereby the amount of calculation according to the maximum likelihood decoding is reduced, and the delay time can be shortened.

The other configurations, operations, and effects are similar to those of the embodiment described above, detailed description thereof will not be presented here.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

TABLE 1

| EUCLID DISTANCE | COMBINATION OF LLR ABSOLUTE VALUE |
| --- | --- |
| 1 | (0, 1) |
| 2 | (0, 2), (1, 1) |
| 3 | (0, 3), (1, 2) |
| 4 | (0, 4), (1, 3), (2, 2) |
| 5 | (0, 5), (1, 4), (2, 3) |
| 6 | (0, 6), (1, 5), (2, 4), (3, 3) |

TABLE 2

| EUCLID DISTANCE | COMBINATION OF LLR ABSOLUTE VALUE |
| --- | --- |
| 1 | (0, 0, 1) |
| 2 | (0, 0, 2), (0, 1, 1) |
| 3 | (0, 0, 3), (0, 1, 2), (1, 1, 1) |
| 4 | (0, 0, 4), (0, 1, 3), (0, 2, 2), (1, 1, 2) |
| 5 | (0, 0, 5), (0, 1, 4), (0, 2, 3), (1, 1, 3), (1, 2, 2) |
| 6 | (0, 0, 6), (0, 1, 5), (0, 2, 4), (0, 3, 3), (1, 1, 4), (1, 2, 3), (2, 2, 2) |

TABLE 3

| EUCLID DISTANCE | COMBINATION OF LLR ABSOLUTE VALUE |
| --- | --- |
| 1 | (0, 0, 1) |
| 2 | (0, 0, 2), (0, 1, 1) |
| 3 | (0, 0, 3), (0, 1, 2), (1, 1, 1) |
| 4 | (0, 0, 4), (0, 1, 3), (0, 2, 2), (1, 1, 2) |
| 5 | (0, 0, 5), (0, 1, 4), (0, 2, 3), (1, 1, 3), (1, 2, 2) |
| 6 | (0, 0, 6), (0, 1, 5), (0, 2, 4), (0, 3, 3), (1, 1, 4), (1, 2, 3), (2, 2, 2) |

TABLE 4

| EUCLID DISTANCE | COMBINATION OF LLR ABSOLUTE VALUE |
| --- | --- |
| 1 | (0, 0, 0, 1) |
| 2 | (0, 0, 0, 2), (0, 0, 1, 1) |
| 3 | (0, 0, 0, 3), (0, 0, 1, 2), (0, 1, 1, 1) |
| 4 | (0, 0, 0, 4), (0, 0, 1, 3), (0, 0, 2, 2), (0, 1, 1, 2), (1, 1, 1, 1) |
| 5 | (0, 0, 0, 5), (0, 0, 1, 4), (0, 0, 2, 3), (0, 1, 1, 3), (0, 1, 2, 2), (1, 1, 1, 2) |
| 6 | (0, 0, 0, 6), (0, 0, 1, 5), . . . , (0, 1, 1, 4), (0, 1, 2, 3), (0, 2, 2, 2), (1, 1, 2, 2) |
| 7 | (0, 0, 0, 7), (0, 0, 1, 6), . . . , (1, 1, 1, 4), (1, 1, 2, 3), (1, 2, 2, 2), (1, 2, 2, 2) |
| 8 | (0, 0, 0, 8), (0, 0, 1, 7), . . . , (1, 1, 2, 4), (1, 1, 3, 3), (1, 2, 2, 3), (2, 2, 2, 2) |

What is claimed is:

1. A memory system comprising:
a nonvolatile memory;
a soft decision value converting unit that converts a received word read from the nonvolatile memory into a received word having a soft decision value;
a list generating unit that generates a list of a plurality of test patterns for the received word having the soft decision value;
a test pattern decoding unit that detects an intermediate decoding word from the test pattern included in the list;
a Euclid distance calculating unit that calculates a Euclid distance between the intermediate decoding word detected by the test pattern decoding unit and the received word; and
a maximum likelihood decoding word selecting unit that maintains a maximum likelihood decoding word candidate,
wherein, in a case where a Euclid distance of a first intermediate decoding word that is an intermediate decoding word detected by the test pattern decoding unit is shorter than a Euclid distance of the maintained maximum likelihood decoding word candidate, the maximum likelihood decoding word selecting unit updates the maintained maximum likelihood decoding word candidate by using the first intermediate decoding word and outputs the maximum likelihood decoding word candidate that is finally maintained as a soft decision output value, and
the test pattern decoding unit does not execute decoding of a test pattern having no possibility that the Euclid distance of the intermediate decoding word becomes shorter than the Euclid distance of the maximum likelihood decoding word candidate maintained by the maximum likelihood decoding word selecting unit.

2. The memory system according to claim 1, wherein the list generating unit generates the list not including the test pattern having no possibility that a Euclid distance of a code word detected by the test pattern decoding unit is shorter than the Euclid distance of the maximum likelihood decoding word candidate maintained by the maximum likelihood decoding word selecting unit on the basis of an absolute value of the soft decision value of a bit that is a flip target of each of the test patterns.

3. The memory system according to claim 2,
wherein the list generating unit generates a list of test patterns that are different for each number of bits to be flipped, and
the test pattern decoding unit sequentially executes decoding from test patterns included in the list having a smaller number of bits to be flipped including a case where the number of bits to be flipped is "0".

4. The memory system according to claim 2,
wherein the predetermined algorithm is a Chase decoding algorithm, and
the list generating unit, when a correctable number of the code word is t, the number of bits to be flipped is f, and, a is an arbitrary natural number, in a case where the maximum likelihood decoding word selecting unit maintains the maximum likelihood decoding word candidate having a Euclid distance of "(f+t)a+t+1", generates the list not including a test pattern of which an absolute value of the soft decision value of a bit that is a flip target is greater than "a".

5. The memory system according to claim 2,
wherein the predetermined algorithm is an ordered statistics decoding (OSD) algorithm, and
the list generating unit, in a case where the maximum likelihood decoding word candidate having a Euclid distance of "c" is maintained by the maximum likelihood decoding word selecting unit, generates the list not including a test pattern in which a sum of absolute values of soft decision values of bits that are flip targets is larger than "c".

6. The memory system according to claim 2,
wherein the predetermined algorithm is an OSD algorithm, and
the list generating unit, in a case where the maximum likelihood decoding word candidate having a Euclid distance of "c" is maintained by the maximum likelihood decoding word selecting unit, when the correctable number of the code word is t, the number of bits to be flipped is j, and a sum of absolute values of soft decision values of (t+1−j) bits in order from a bit of which the absolute value of the soft decision value is smallest in the code word is m, generates the list not including a test pattern of which a sum of absolute values of soft decision values of bits that are flip targets is larger than "c−m".

7. The memory system according to claim 1, further comprising a test pattern reducing unit that deletes a test pattern having no possibility that a Euclid distance of a code word detected by the test pattern decoding unit is shorter than the Euclid distance of the maximum likelihood decoding word candidate maintained by the maximum likelihood decoding word selecting unit from the list on the basis of an absolute value of the soft decision value of a bit that is a flip target of each of the test patterns.

8. The memory system according to claim 7,
wherein the predetermined algorithm is a Chase decoding algorithm, and
the test pattern reducing unit, when a correctable number of the code word is t, the number of bits to be flipped is f, and, a is an arbitrary natural number, in a case where the maximum likelihood decoding word selecting unit maintains the maximum likelihood decoding word candidate having a Euclid distance of "(f+t)a+t+1", deletes a test pattern of which an absolute value of the soft decision value of a bit that is a flip target is greater than "a" from the list.

9. The memory system according to claim 7,
wherein the predetermined algorithm is an OSD algorithm, and
the test pattern reducing unit, in a case where the maximum likelihood decoding word candidate having a Euclid distance of "c" is maintained by the maximum likelihood decoding word selecting unit, deletes a test pattern in which a sum of absolute values of soft decision values of bits that are flip targets is larger than "c" front the list.

10. The memory system according to claim 7,
wherein the predetermined algorithm is an OSD algorithm, and
the test pattern reducing unit, in a case where the maximum likelihood decoding word candidate having a Euclid distance of "c" is maintained by the maximum likelihood decoding word selecting unit, when the correctable number of the code word is t, the number of bits to be flipped is j, and a sum of absolute values of soft decision values of (t+1−j) bits in order from a bit of which the absolute value of the soft decision value is smallest in the code word is m, deletes a test pattern of which a sum of absolute values of soft decision values of bits that are flip targets is larger than "c−m" from the list.

11. The memory system according to claim 1, further comprising a test pattern execution determining unit that skips decoding using the test pattern decoding unit for a test pattern having no possibility that a Euclid distance of a code word detected by the test pattern decoding unit is shorter than the Euclid distance of the maximum likelihood decoding word candidate maintained by the maximum likelihood decoding word selecting unit among the test patterns included in the list generated by the list generating unit on the basis of an absolute value of the soft decision value of a bit that is a flip target of each of the test patterns.

12. The memory system according to claim 11,
wherein the predetermined algorithm is a Chase decoding algorithm, and
the test pattern execution determining unit, when a correctable number of the code word is t, the number of bits to be flipped is f, and, a is an arbitrary natural number, in a case where the maximum likelihood decoding word selecting unit maintains the maximum likelihood decoding word candidate having a Euclid distance of "(f+t)a+t+1", skips decoding by using the test pattern decoding unit for a test pattern of which an absolute value of the soft decision value of a bit that is a flip target is greater than "a".

13. The memory system according to claim 11,
wherein the predetermined algorithm is an OSD algorithm, and
the test pattern execution determining unit, in a case where the maximum likelihood decoding word candidate having a Euclid distance of "c" is maintained by the maximum likelihood decoding word selecting unit, skips decoding using the test pattern decoding unit for a test pattern in which a sum of absolute values of soft decision values of bits that are flip targets is larger than "c".

14. The memory system according to claim 11,
wherein the predetermined algorithm is an OSD algorithm, and
the test pattern execution determining unit, in a case where the maximum likelihood decoding word candidate having a Euclid distance of "c" is maintained by the maximum likelihood decoding word selecting unit, when the correctable number of the code word is t, the number of bits to be flipped is j, and a sum of absolute values of soft decision values of (t+1−j) bits in order from a bit of which the absolute value of the soft decision value is smallest in the code word is m, skips decoding using the test pattern decoding unit for a test pattern of which a sum of absolute values of soft decision values of bits that are flip targets is larger than "c−m".

15. The memory system according to claim 1, wherein the test pattern decoding unit decodes a test pattern having a bit having low reliability as a flip target with a high priority level among the test patterns included in the list.

16. The memory system according to claim 1, wherein the Euclid distance calculating unit calculates a total sum of absolute values of one or more soft decision values corresponding to a bit flipped by the list generating unit and one or more error bits detected by the test pattern decoding unit as the Euclid distance.

17. The memory system according to claim 1, further comprising a hard decision value converting unit that converts the soft decision output value output from the maximum likelihood decoding word selecting unit into a code word having a hard decision value.

18. A method of controlling a nonvolatile memory, the method comprising:
reading a received word from the nonvolatile memory;
converting the read received word into a received word having a soft decision value;
generating a list of a plurality of test patterns for the received word having the soft decision value;
detecting a first intermediate decoding word from a first test pattern included in the list;
calculating a first Euclid distance between the first intermediate decoding word and the received word;
maintaining the first intermediate decoding word as a maximum likelihood decoding word candidate;
detecting a second intermediate decoding word from a second test pattern included in the list;

calculating a second Euclid distance between the second intermediate decoding word and the received word;

updating the maintained maximum likelihood decoding word candidate by using the second intermediate decoding word in a case where the second Euclid distance is shorter than the first Euclid distance; and outputting the maximum likelihood decoding word candidate that is finally maintained as a soft decision output value, wherein a test pattern having no possibility that a Euclid distance of the detected intermediate decoding word becomes shorter than the first Euclid distance is not used in the detection of the second intermediate decoding word.

19. The controlling method according to claim 18, wherein, in the generating of a list, the list is generated not to include the test pattern having no possibility that a Euclid distance is shorter than the Euclid distance of the maximum likelihood decoding word candidate maintained by the maximum likelihood decoding word selecting unit on the basis of an absolute value of the soft decision value of a bit that is a flip target of each of the test patterns.

20. The controlling method according to claim 18, further comprising deleting a test pattern having no possibility that a Euclid distance is shorter than the Euclid distance of the maximum likelihood decoding word candidate maintained by the maximum likelihood decoding word selecting unit from the list on the basis of an absolute value of the soft decision value of a bit that is a flip target of each of the test patterns.

* * * * *